US006861917B2

(12) United States Patent
Stevenson et al.

(10) Patent No.: US 6,861,917 B2
(45) Date of Patent: Mar. 1, 2005

(54) OSCILLATOR SYSTEM WITH SWITCHED-CAPACITOR NETWORK AND METHOD FOR GENERATING A PRECISION TIME REFERENCE

(75) Inventors: Paul E. Stevenson, Colorado Springs, CO (US); Jon E. Tourville, Colorado Springs, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/444,311

(22) Filed: May 22, 2003

(65) Prior Publication Data

US 2004/0233000 A1 Nov. 25, 2004

(51) Int. Cl.[7] .............................. H03B 5/04; H03B 5/06; H03B 5/32
(52) U.S. Cl. ................... 331/183; 331/109; 331/116 R; 331/158; 331/173; 331/177 R
(58) Field of Search ............................. 331/109, 116 R, 331/116 FE, 158, 173, 177 R, 182, 183

(56) References Cited

U.S. PATENT DOCUMENTS 5,966,053 A * 10/1999 Durig et al. ............ 331/116 M

OTHER PUBLICATIONS

Vittoz, Eric A., et al., "High–Performance Crystal Oscillator Circuits: Theory and Application", *IEEE Journal of Solid–State Circuits*, vol. 23, No. 3, (Jun. 1988), 774–783.

* cited by examiner

*Primary Examiner*—David Mis
(74) *Attorney, Agent, or Firm*—Schwegman, Lundberg, Woessner & Kluth, P.A.

(57) ABSTRACT

Briefly, in accordance with embodiments of the invention, switched capacitors may be utilized to emulate resistors in a longer time constant feedback network for amplitude regulation of a crystal oscillator.

24 Claims, 3 Drawing Sheets

OSCILLATOR SYSTEM WITH SWITCHED-CAPACITOR NETWORK AND METHOD FOR GENERATING A PRECISION TIME REFERENCE

TECHNICAL FIELD

Embodiments of the present invention pertain to crystal oscillators, and in some embodiments, to processing systems such as wireless communication devices and other systems and devices that use a precision time reference.

BACKGROUND

Crystal oscillators and crystal-oscillator systems are used to provide a precision time reference for many applications, such as processing and computing systems including communication devices. Some conventional crystal-oscillator systems employ large resistors and/or capacitors for low-pass filtering as part of a feedback process to limit the amplitude of the oscillation frequency. One problem with these conventional crystal-oscillator systems is that the large resistors and capacitors usually require a large amount of circuit area on a die. Another problem with these large resistors and capacitors is that they are susceptible to process variations making it difficult to design and fabricate accurate oscillator circuits. Another problem with these conventional crystal-oscillator systems is that their output level may vary over time due to environmental factors.

Thus, there are needs for improved oscillators and methods.

BRIEF DESCRIPTION OF THE DRAWINGS

The appended claims are directed to some of the various embodiments of the present invention. However, the detailed description presents a more complete understanding of embodiments of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of embodiments of the invention encompasses the full ambit of the claims and all available equivalents of those claims.

Figure 1:
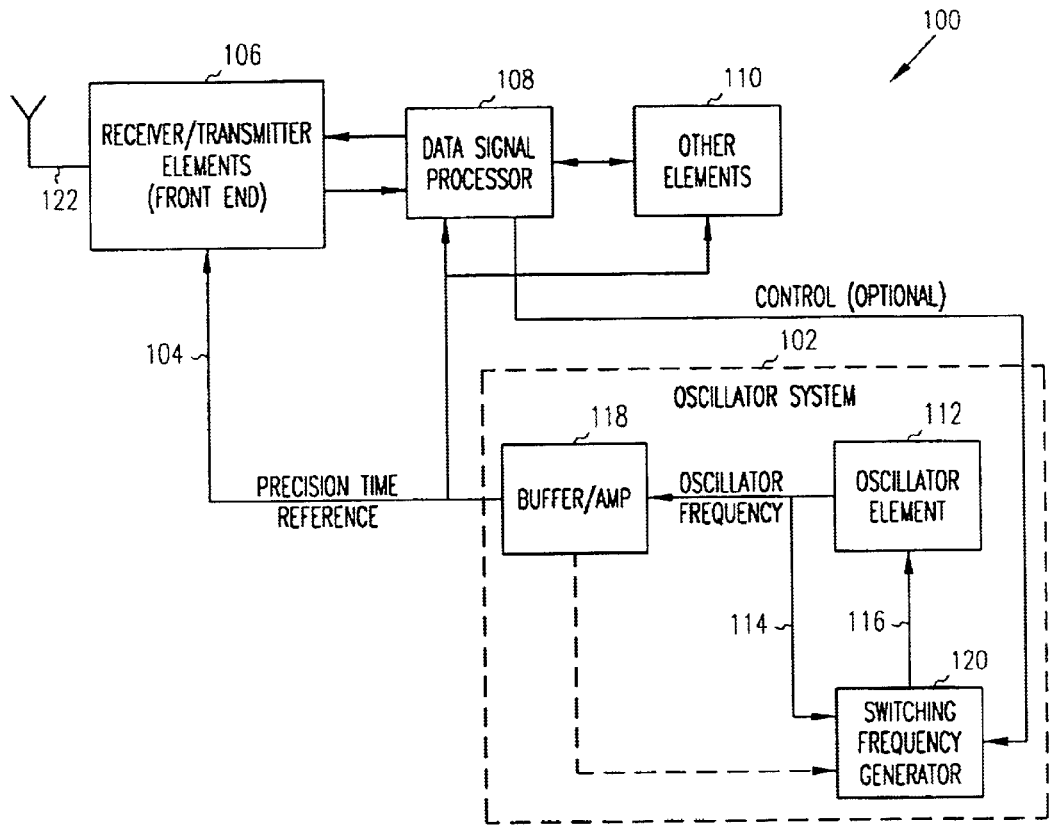
FIG. 1 is a block diagram of a system in accordance with embodiments of the present invention.

FIG. 1 is a block diagram of a system in accordance with embodiments of the present invention. System 100 may be part of any computing or processing system including computer systems, server systems, and wireless communication devices and systems. System 100 includes oscillator system 102 to generate precision time reference 104 for use by system elements. System elements which use precision time reference 104 may include, for example, receiver/transmitter elements 106, data-signal processing elements 108, and other system elements 110 including phase-locked loops, displays and I/O devices. In some embodiments, elements 106, 108 and/or 110 may be on-chip elements.

Oscillator system 102 may include oscillator element 112 to generate oscillation frequency 114 and a switching-frequency generator 120 to provide switching frequency 116. Switching frequency 116 may be responsive to oscillation frequency 114. In embodiments, switching frequency 116 may be a multiple of oscillation frequency 114. Oscillator system 102 may also include buffer-amplifier element 118 which may instruct switching-frequency generator 120 to generate a multiple of the oscillation frequency when the oscillation frequency is determined to be stable. In some embodiments, the stability of the oscillator frequency may be determined based on a number of clock cycles (e.g., after power up). In other embodiments, the stability of the oscillator frequency may be determined by sampling energy of the oscillation frequency and setting a latch when the energy exceeds a predetermined threshold.

In embodiments, switching-frequency generator 120 may generate switching frequency 116 as a multiple of oscillation frequency 114. Buffer-amplifier element 118 may receive oscillation frequency 114 and determine when the oscillation-frequency output is stable. In one embodiment, a system element, such as data-signal processing element 108, may provide a control signal to switching-frequency generator 120 to tailor oscillation frequency 114 for individual circuit variances. For example, process variation may cause one chip to require a switching frequency of 1.000 MHz for minimum power consumption while another chip may require 1.001 MHz. In embodiments, processing element 108 may initially, continuously, and/or intermittently monitor the oscillation frequency and may adjust the switching frequency to reduce the oscillation amplitude to allow each chip to operate its oscillator at a minimum power level. In some embodiments, processing element 108 may adjust the switching frequency as a battery condition changes, or as the temperature changes to help keep the oscillator at an amplitude level which may minimize power consumption.

In embodiments, buffer-amplifier element 118 may perform signal buffering and amplification to generate precision time reference 104 comprising a square wave suitable for CMOS applications. In some embodiments, element 118 may have hysteresis for noise isolation. In some embodiments, element 118 may instruct switching-frequency generator 120 to vary the characteristics of the switching frequency to change or substantially maintain the level of the oscillation-frequency output, for example, to compensate for environmental changes affecting the oscillator. In embodiments, oscillation frequency 114 and precision timing reference 104 may be almost any predetermined frequency. For example, oscillation frequency 114 and precision timing reference 104 may be around 32 kHz (e.g., 32.768 kHz), around 13 MHz, or around 3.6 MHz (e.g., 3.686 MHz) and multiples thereof The exact frequency may depend on the requirements of the system or system elements.

Figure 2:
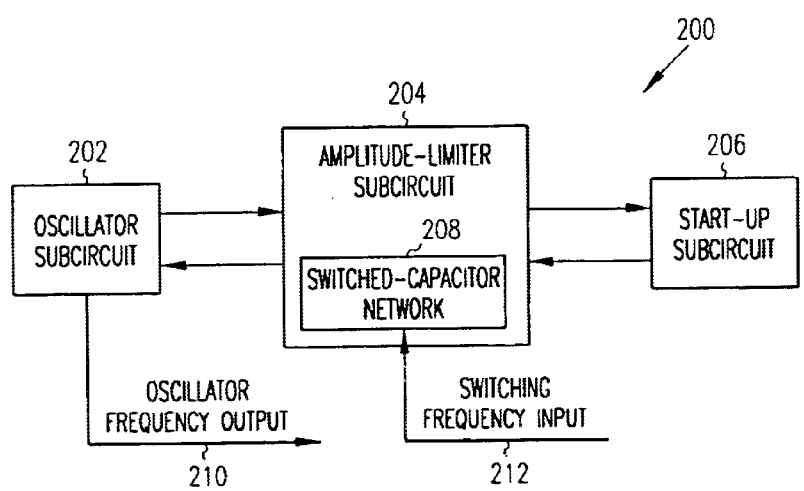
FIG. 2 is a block diagram of an oscillator element in accordance with embodiments of the present invention.

In embodiments, oscillator element 112 may include an oscillator sub-circuit to generate oscillation frequency 114 and an amplitude-limiter sub-circuit to provide feedback to the oscillator sub-circuit to control a level of oscillation frequency 114. An example of an oscillator element is illustrated in FIG. 2. The amplitude-limiter sub-circuit may include a switched-capacitor network to control the feedback based on switching frequency 116 and the level of oscillation frequency 114. In embodiments, switching elements of the switched-capacitor network may be switched in opposition when oscillation frequency 114 is stable. In some embodiments, characteristics of switching frequency 116 may be varied to change the level of oscillation frequency 114. The characteristics of the switching frequency that may be varied include at least the switching rate/or the duty cycle. In embodiments, the oscillation frequency may be controlled by a ceramic, quartz or another piezoelectric type material which have either a crystalline or a non-crystalline structure.

In embodiments, system 100 may be a wireless communication device and may include receiver/transmitter elements 106. In these embodiments, elements 106 may receive and/or transmit RF communications using antenna 122. In these embodiments, system 100 may, for example, be a personal digital assistant (PDA), a laptop or portable computer with wireless communication capability, a web tablet, a wireless telephone, a wireless headset, a pager, an instant messaging device, an MP3 player, a digital camera, an access point, or other device that may receive and/or transmit information wirelessly. In these embodiments, elements 106 may receive and/or transmit RF communications in accordance with specific communication standards, such as the IEEE 802.11 (a), 802.11 (b) and/or 802.11 (g) standards for wireless local area network (LAN) standards, although elements 106 may receive and/or transmit communications in accordance with other techniques including Digital Video Broadcasting Terrestrial (DVB-T) broadcasting standard, and the High performance radio Local Area Network (HiperLAN) standard.

Antenna 122 may comprise a directional or omni-directional antenna including a dipole antenna, a monopole antenna, a loop antenna, a microstrip antenna or other type of antenna suitable for reception and/or transmission of RF signals. Elements 106 may provide convert RF signals to data signals for processing by data-signal processing elements 108 and for use by other elements 110 as part of the operation of system 100. Data-signal processing elements 108 may also provide data signals to elements 106 for conversion to RF signals and transmission by antenna 122.

Although system 100 is illustrated as having several separate functional elements, one or more of the functional elements may be combined and may be implemented by combinations of software configured elements, such as processing elements including digital signal processors (DSPs), and/or other hardware elements. For example, processing elements may comprise one or more microprocessors, DSPs, application specific integrated circuits (ASICs), and combinations of various hardware and logic circuitry for at least performing the functions described herein.

FIG. 2 is a block diagram of an oscillator element in accordance with embodiments of the present invention. Oscillator element 200 may be suitable for use as oscillator element 112 (FIG. 1) although other oscillation elements may also be suitable. Oscillation element 200 may include oscillator sub-circuit 202 to generate oscillation-frequency output 210, and amplitude-limiter sub-circuit 204 to provide feedback to oscillator sub-circuit 202 to control and/or limit a level of oscillation-frequency output 210. Oscillator element 200 may also include startup sub-circuit 206 to initially set bias of elements of oscillator sub-circuit 202 and/or amplitude-limiter sub-circuit 204 at power up.

In accordance with embodiments of the present invention, amplitude-limiter sub-circuit 204 includes switched-capacitor network 208 to help control the feedback to oscillator sub-circuit 202 based, at least in part, on switching-frequency input 212 and the level of oscillation-frequency output 210. In embodiments, switching-frequency input 212 may be provided by a switching-frequency generator, such as switching-frequency generator 120 (FIG. 1).

Figure 3:
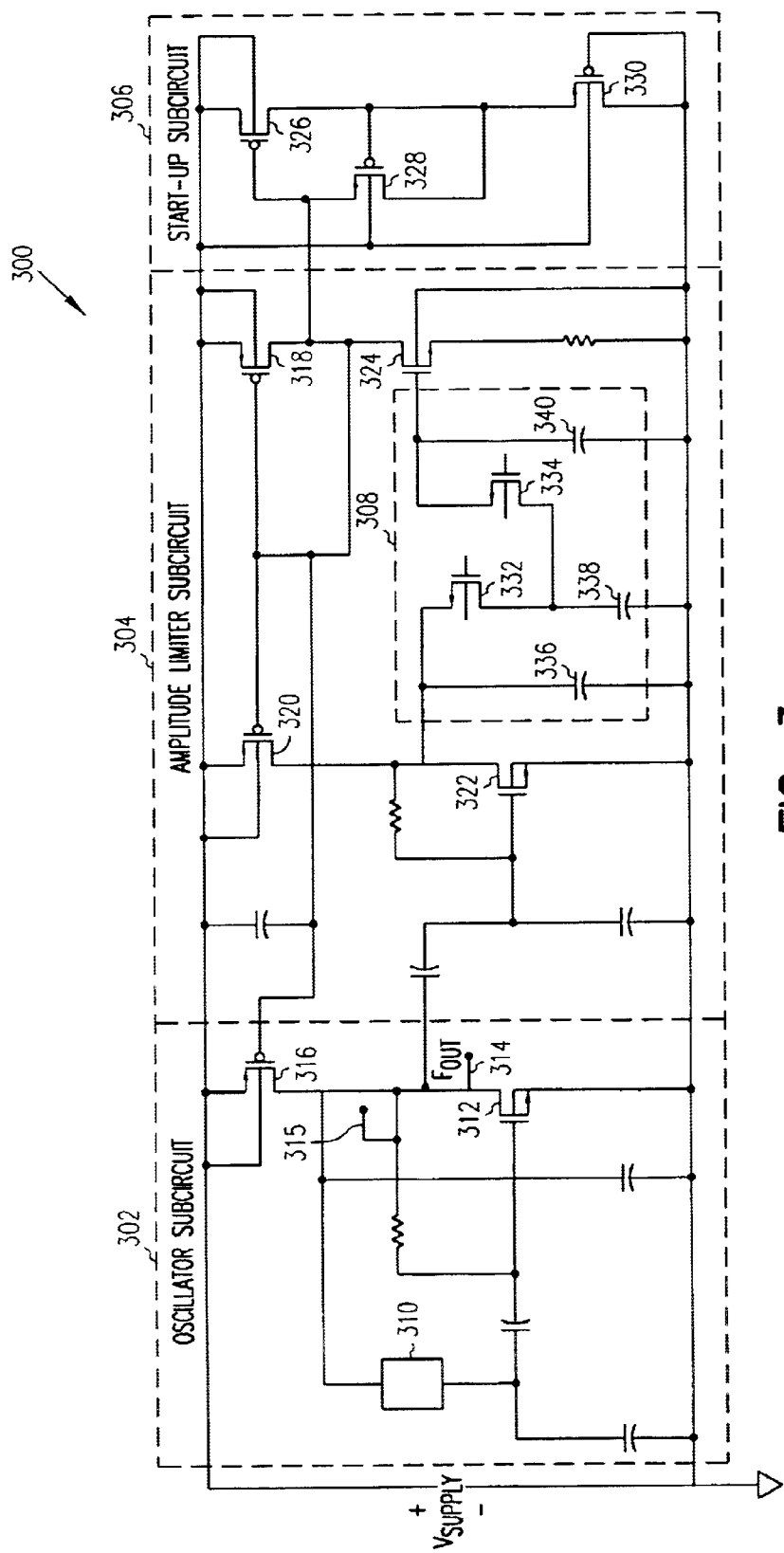
FIG. 3 is a circuit diagram of an oscillator element in accordance with embodiments of the present invention.

FIG. 3 is a circuit diagram of an oscillator element in accordance with embodiments of the present invention. Oscillator element 300 may be suitable for use as oscillator element 200 (FIG. 2), although other circuits may also be suitable. Oscillator element 300 comprises oscillator sub-circuit 302, amplitude-limiter sub-circuit 304 and startup sub-circuit 306 which may correspond respectively with oscillator sub-circuit 202 (FIG. 2), amplitude-limiter sub-circuit 204 (FIG. 2) and startup sub-circuit 206 (FIG. 2). Amplitude-limiter sub-circuit 304 includes switched-capacitor network 308 which may correspond with switched-capacitor network 208 (FIG. 2).

Oscillation sub-circuit 302 includes crystal 310 and transistor element 312 which may amplify and invert a voltage which may develop across crystal 310. Element 312 may provide oscillation-frequency output 314. Transistor element 316 may be a current source for element 312, and may be a current mirroring element which mirrors current of transistor element 318 of amplitude-limiter sub-circuit 304. Crystal 310 may comprise almost any ceramic, quartz or other piezoelectric-type material, and may have a crystalline or non-crystalline structure. In embodiments, crystal 310 may have a high "Q" mechanical resonance.

Amplitude-limiter sub-circuit 304 includes transistor elements 318, 320, 322 and 324, which, along with switched-capacitor network 308, may perform an amplitude-regulating function to limit and/or control the amplitude of the oscillation frequency at output 314. Startup sub-circuit 306 may include transistor elements 326, 328 and 330 and may initially provide a bias for elements 316, 318 and 320 at power up. Switched-capacitor network 308 includes switching elements 332 and 334 along with capacitive elements 336, 338 and 340. In operation, switching element 332 may transfer charge from capacitive element 336 to capacitive element 338, and switching element 334 may transfer charge from capacitive element 338 to capacitive element 340. In embodiments, switching elements 332 and 334 may be alternatively switched (e.g., driven in opposition) by a switching frequency received at their inputs. The switching frequency may be a multiple of the oscillation frequency, and may be provided by switching-frequency generator 120 (FIG. 1). Initially, switching elements 332 and 334 may be closed to create a DC path between the inputs of elements 322 and 324 to help establish initial startup conditions.

The amount of charge provided to element 324 changes the bias of element 318 and the current through element 318 may be mirrored in element 316. The current in element 316 may be proportional to the current through element 318 depending on the relationship of the sizes of the devices. In embodiments, element 316 may be a factor larger (e.g., 5×) than device 318 and may carry proportionally more current.

Before oscillation amplitude has grown large, elements 318, 320, 322 and 324 provide DC bias to supply element 312 with current. As the amplitude of the oscillation frequency at output 314 increases, element 312 drives an AC signal onto the input of element 322. If the AC signal has a certain amplitude, element 322 may pull current proportional to the amplitude squared off of capacitive element 336. This may cause a voltage on the input of element 324 to drop, reducing the current available to element 312, reducing the AC amplitude until a static operating point is achieved.

Switching-capacitor network 308 may help reduce the semiconductor die area of element 300 while providing low-power amplitude limiting of the oscillation frequency. Although switching elements 332 and 334 are illustrated as specific-type transistor switching elements, this is not a requirement. In embodiments, switching elements 332 and 334 may be almost any switch or switching element, including, for example, a MEMS relay. In some embodiments, element 332 and element 334 may comprise transmission gates and may use both an NMOS and a PMOS device for better charge transfer. Capacitive elements 338 and 340 may be almost any size as their ratio and the switching frequency primarily may control the filter characteristics of network 308.

When oscillator element 300 is first powered up, both element 332 and element 334 may be closed, creating a DC path between the inputs of element 322 and element 324. The current source is biased which starts element 312. When the oscillation becomes stable, element 332 and element 334 may be driven in opposition at a multiple of the oscillator frequency. Charge may then be transferred onto capacitive element 338 when element 332 is closed and element 334 open setting the voltage on capacitive element 338 to the voltage on capacitive element 336. When element 332 opens and when element 334 closes, capacitive element 338 modifies the voltage on capacitive element 340 and the voltage on the input of element 324. In this way, capacitive element 338 behaves as a resistor, and the value of resistance may be controlled by the frequency of switching of element 332 and element 334. A reduction in semiconductor die area may be achieved over conventional low-pass filters with may use large resistances and capacitances. In embodiments of the present invention, capacitive element 338 is ratioed to capacitive element 340 and capacitive element 336, and since process technology may control capacitance much better than resistance, an increase in precision may also be achieved.

In one embodiment, element 332 and element 334 are switched with the open and close times at a different duty cycle and/or switching rate than the primary frequency. In this way, a processor may control the switching and an adaptive algorithm may tailor the duty cycle and/or switching rate to accommodate environmental changes. Although circuit 300 is illustrated to include resistors and capacitors, one or more of such resistors and/or capacitors may be implemented with active devices, such as transistors, rather than with passive devices.

In one embodiment, the oscillation frequency may be provided at output 315 which is an input node for element 312. Output 315 may be instead of or in addition to output 314. In some cases, output 315 may provide a cleaner sinusoid signal for subsequent amplification than the sinusoid signal at output 314. In this embodiment, output 315 may provide oscillation frequency 114 (FIG. 1) and may correspond with oscillation-frequency output 210 (FIG. 2).

In some embodiments, a switching element may be placed between the output of element 312 and the input of element 322 to disconnect amplitude limiter sub-circuit 304 from oscillator sub-circuit 302 until the oscillation has stabilized and the switching frequency 116 (FIG. 1) has been generated. When the oscillation is stable and switching frequency is available to amplitude limiter sub-circuit 304, the switching element can be closed allowing amplitude limiter sub-circuit 304 to sample the level of oscillation.

Figure 4:
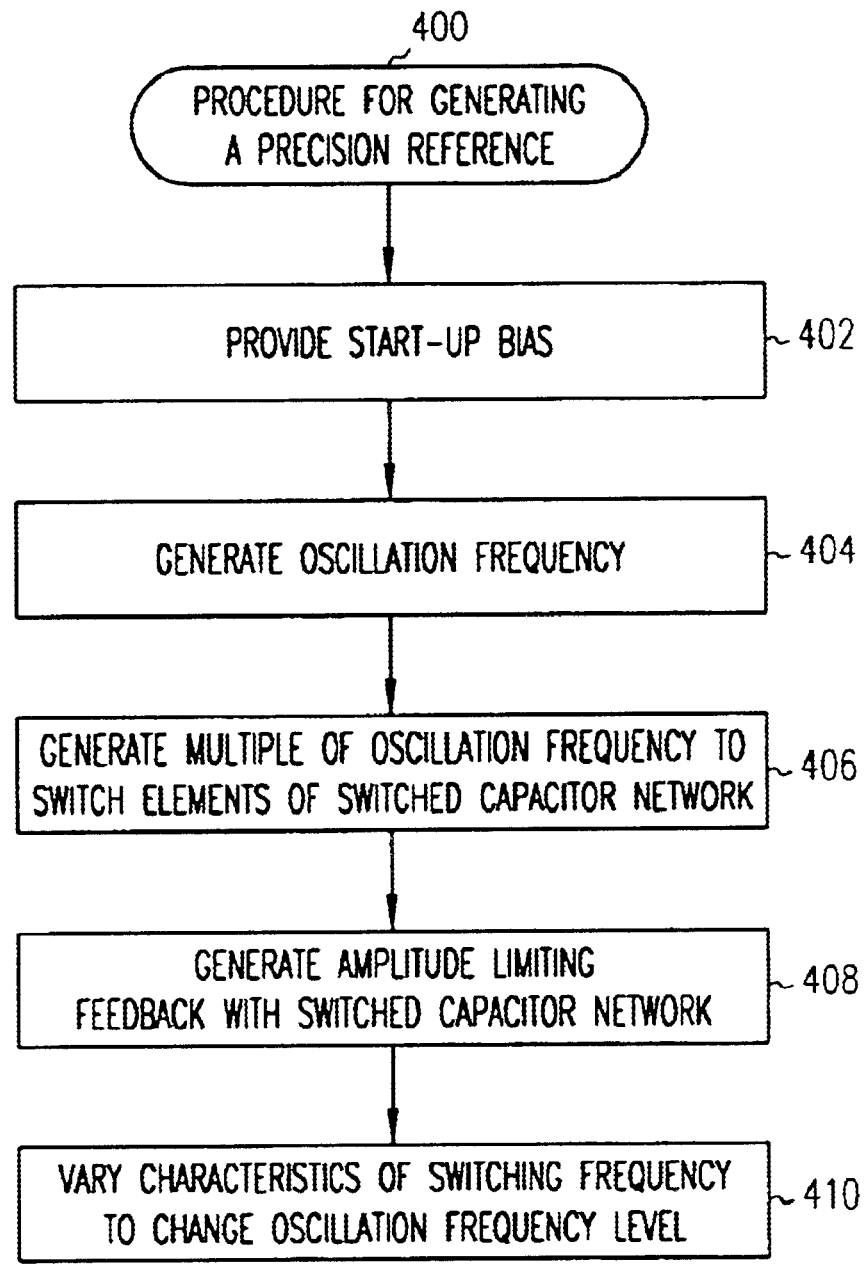
FIG. 4 is a flow chart of a precision time reference generating procedure in accordance with embodiments of the present invention.

FIG. 4 is a flow chart of a precision time reference generating procedure in accordance with embodiments of the present invention. Precision time reference generating procedure 400 may be performed by an oscillator system, such as oscillator system 102 (FIG. 1), although other systems may also be suitable for performing procedure 400. Procedure 400 may be used for generating almost any precision time reference signal for use in almost any computing or processing system or device.

In operation 402, a startup bias may be provided at power up to allow an oscillator to begin generating an oscillation frequency. Operation 402 may be performed by startup circuitry, such as startup sub-circuit 206 (FIG. 2). In operation 404, an oscillation frequency is generated. Operation 404 may be performed by oscillator circuitry, such as oscillation sub-circuit 202 (FIG. 2).

In operation 406, a switching frequency may be generated and provided to switching elements of a switched-capacitor network used as part of an amplitude limiting sub-circuit of an oscillation system. The switching frequency may be a multiple of the oscillation frequency and may be generated when the oscillation frequency is stable. Operation 406 may be performed by switching-frequency generator 120 (FIG. 1) and buffer-amplifier element 118 (FIG. 1) may determine when the oscillation frequency is stable.

In operation 408, amplitude-limiting feedback may be generated to control or limit the amplitude of the oscillation frequency. The amplitude-limiting feedback may be generated by an amplitude limiter, such as amplitude-limiter sub-circuit 204 (FIG. 2) based on the switching frequency generated in operation 406 as well as the amplitude level of the oscillation frequency generated in operation 404. Operations 404, 406 and 408 may be performed substantially concurrently to generate a precision time reference.

In some embodiments, operation 410 may be performed. In operation 410, the characteristics, such as the duty cycle and/or switching rate, of the switching frequency may be varied to change the level of the oscillation-frequency output.

Operation 410 may be performed, for example, by buffer-amplifier element 118 (FIG. 1). Although the individual operations of procedure 400 are illustrated and described as separate operations, one or more of the individual operations may be performed concurrently and nothing requires that the operations be performed in the order illustrated.

It is emphasized that the Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

In the foregoing detailed description, various features are occasionally grouped together in a single embodiment for the purpose of streamlining the disclosure. This method of disclosure is not to be interpreted as reflecting an intention that the claimed embodiments of the subject matter require more features that are expressly recited in each claim. Rather, as the following claims reflect, inventive subject matter lies in less than all features of a single disclosed embodiment. Thus the following claims are hereby incorporated into the detailed description, with each claim standing on its own as a separate preferred embodiment.

What is claimed is:

1. An oscillator system comprising:
   an oscillator sub-circuit to generate an oscillation frequency; and
   an amplitude-limiter sub-circuit to provide feedback to the oscillator sub-circuit to control an amplitude level of the oscillation frequency,
   wherein the amplitude-limiter sub-circuit includes a switched-capacitor network to control the feedback based on a switching frequency and the amplitude level of the oscillation frequency.

2. The oscillator system of claim 1 further comprising a switching-frequency generator to generate the switching frequency as a multiple of the oscillation frequency.

3. The oscillator system of claim 1 further comprising a buffer-amplifier circuit to receive the oscillation frequency and to set a multiple-bit latch when the oscillation frequency is determined to be stable.

4. The oscillator system of claim 1 further comprising a switching-frequency generator to generate the switching frequency as a multiple of the oscillation frequency, the switching-frequency generator to switch switching circuits of the amplitude-limiter sub-circuit in opposition when the oscillation frequency is determined to be stable.

5. The oscillator system of claim 1 further comprising a switching-frequency generator to generate the switching frequency, the switching-frequency generator to switch switching circuits of the amplitude-limiter sub-circuit in opposition, the switching-frequency generator to vary the switching of the switching circuits to change the amplitude level of the oscillation frequency.

6. The oscillator system of claim 1 further comprising a switching-frequency generator to generate the switching frequency, the switching-frequency generator to switch switching circuits of the amplitude-limiter sub-circuit in opposition, the switching-frequency generator to vary the switching of the switching circuits to substantially maintain the amplitude level of the oscillation frequency to compensate for environmental changes affecting the oscillator.

7. The oscillator system of claim 1 wherein the switched-capacitor network comprises:
   a first switching circuit to transfer charge from a first capacitive circuit to a second capacitive circuit; and
   a second switching circuit to transfer charge from the second to a third capacitive circuit,
   the first and second switching circuits to be alternatively switched at the switching frequency, the switching frequency being a multiple of the oscillation frequency.

8. The oscillator system of claim 7 wherein the amplitude-limiter sub-circuit comprises:
   a first current setting circuit to provide the feedback to set a current of a current mirroring circuit of the oscillator sub-circuit; and
   a second current setting circuit to receive charge from the third capacitor and to set a gate bias voltage of the first current setting circuit.

9. The oscillator system of claim 8 wherein a drain of the second current setting circuit is coupled with a drain and a gate of the first current setting circuit and a gate of the current mirroring circuit, the current mirroring circuit to proportionally mirror current of the first current setting circuit.

10. The oscillator system of claim 8 wherein the amplitude-limiter sub-circuit further comprises an active circuit to receive the oscillation frequency from the oscillator sub-circuit and generate a signal for the first switching circuit inversely proportional to the amplitude level the oscillation frequency.

11. The oscillator system of claim 8 further comprising a startup sub-circuit to initially set current in at least the current mirroring circuit.

12. A method of generating a precision time reference comprising:
   generating an oscillation frequency; and
   providing a switching frequency to a switched-capacitor network to generate feedback to control an amplitude level of the oscillation frequency.

13. The method of claim 12 wherein the switching frequency comprises multiple of the oscillation frequency, the switching frequency to further control the level of the oscillation frequency.

14. The method of claim 13 further comprising instructing a switching-frequency generator to generate the multiple of the oscillation frequency when the oscillation frequency is determined to be stable.

15. The method of claim 12 further comprising varying characteristics of the switching frequency to change the amplitude level of the oscillation frequency, the characteristics including at least one of either a switching rate or duty cycle.

16. An oscillator system comprising:
   an oscillator circuit to generate an oscillation frequency;
   a switching-frequency generator to provide a switching frequency to the oscillator circuit as a multiple of the oscillation frequency; and
   a buffer-amplifier circuit to instruct the switching-frequency generator to generate the multiple of the oscillation frequency when the oscillation frequency is determined to be stable.

17. The oscillator system of claim 16 wherein the oscillator circuit comprises an oscillator sub-circuit to generate the oscillation frequency, and an amplitude-limiter sub-circuit to provide feedback to the oscillator sub-circuit to control a level of the oscillation frequency, the amplitude-limiter sub-circuit including a switched-capacitor network to control the feedback based on the switching frequency and the level of the oscillation frequency.

18. The oscillator system of claim 17 wherein the switching frequency switches switching circuits of the switched-capacitor network in opposition when the buffer-amplifier circuit determines that the oscillation frequency stable.

19. The oscillator system of claim 17 wherein the switching-frequency generator varies characteristics of the switching frequency to change the level of the oscillation frequency, the characteristics including at least one of either a switching rate or duty cycle of the switching frequency.

20. A system comprising:
   an omni-directional antenna to communicate RF signals;
   a receiver to convert the RF signals to data signals; and
   an oscillator system to provide a precision time reference to the receiver for use in converting the RF signals to the data signals, the oscillator system comprising an oscillator circuit to generate an oscillation frequency, a switching-frequency generator to provide a switching frequency to the oscillator circuit as a multiple of the oscillation frequency, and a buffer-amplifier circuit to generate the precision timing reference from the oscillation frequency.

21. The system of claim 20 wherein the buffer-amplifier circuit instructs the switching-frequency generator to generate the multiple of the oscillation frequency when the oscillation frequency is determined to be stable after a predetermined number of clock cycles.

22. The system of claim 21 wherein the oscillator circuit comprises an oscillator sub-circuit to generate the oscillation frequency, and an amplitude-limiter sub-circuit to provide feedback to the oscillator sub-circuit to control a level of the oscillation frequency, the amplitude sub-circuit including a switched-capacitor network to control the feedback based on the switching frequency and the level of the oscillation frequency.

23. The system of claim 22 wherein the switching frequency switches switching circuits of the switched-capacitor network in opposition when the buffer-amplifier circuit determines that the oscillation frequency stable.

24. The system of claim 22 wherein the switching-frequency generator varies characteristics of the switching frequency to change the level of the oscillation frequency, the characteristics including at least one of either a switching rate or duty cycle.

* * * * *